United States Patent
Yoshioka et al.

(10) Patent No.: US 8,100,379 B2
(45) Date of Patent: Jan. 24, 2012

(54) MOLD FOR PRODUCING SILICA CRUCIBLE

(75) Inventors: Takuma Yoshioka, Akita (JP); Masaki Morikawa, Akita (JP)

(73) Assignee: Japan Super Quartz Corporation, Akita-shi (JP)

( * ) Notice: Subject to any disclaimer, the term of this patent is extended or adjusted under 35 U.S.C. 154(b) by 215 days.

(21) Appl. No.: 12/688,555

(22) Filed: Jan. 15, 2010

(65) Prior Publication Data

US 2010/0178375 A1    Jul. 15, 2010

(30) Foreign Application Priority Data

Jan. 15, 2009    (JP) .................... 2009-006201

(51) Int. Cl.
  *C30B 13/06*    (2006.01)
  *B29C 39/08*    (2006.01)

(52) U.S. Cl. ........ 249/117; 249/134; 249/137; 249/160; 65/144; 65/302

(58) Field of Classification Search .......... 249/98, 249/117, 134, 137, 160; 65/144, 302
See application file for complete search history.

(56) References Cited

U.S. PATENT DOCUMENTS 3,155,479 A * 11/1964 Zimmerman ............. 249/137
7,160,387 B2 * 1/2007 Kishi et al. ............... 117/13
7,716,948 B2 * 5/2010 Kemmochi et al. ...... 264/114

FOREIGN PATENT DOCUMENTS

JP    2006-96616 A    4/2006

* cited by examiner

*Primary Examiner* — Richard Crispino
*Assistant Examiner* — Thukhanh Nguyen
(74) *Attorney, Agent, or Firm* — Christensen O'Connor Johnson Kindness PLLC

(57) ABSTRACT

There is provided a mold for use in the production of a silica crucible by heat-fusing silica or quartz powder attached onto an inner wall of a rotating mold, wherein an inner side of an upper opening portion of the mold corresponding to an upper part of the silica crucible is ground to obtain a step portion and a ring-shaped heat insulating barrier member having an inner diameter smaller than that of the mold is disposed on the step portion through a hollow disk-shaped support member having an inner diameter equal to or somewhat larger than that of the heat insulating barrier member.

8 Claims, 2 Drawing Sheets

(a)

(b)

MOLD FOR PRODUCING SILICA CRUCIBLE

BACKGROUND

1. Field of the Invention

This invention relates to a mold suitable for use in the production of a silica crucible used when producing a silicon single crystal ingot by a pulling method such as the CZ method or the like.

Particularly, the invention is directed to advantageously reduce material cost by devising an upper form of an inner wall in an opening portion of the mold.

2. Description of the Related Art

Recently, the use of a silicon wafer as a substrate for semiconductor devices has increased rapidly. Such a silicon wafer is usually produced by forming a silicon single crystal ingot and then slicing it.

Such a silicon single crystal ingot is generally produced, for example, by a pulling method such as the CZ method or the like. Also, a silica crucible is used for pulling the silicon single crystal.

A typical method of producing a silica crucible is known as the rotating mold method. The rotating mold method is a method wherein silica or quartz powder is attached to an inner wall of a rotating mold, that is, a bottom surface and a side surface of the mold and then fused by heating (e.g., by arc heating) to produce a silica crucible.

Recently, the silicon single crystal ingot is desired to have a larger diameter in association with the rapid increase in the demand for silicon wafers.

When such a large-diameter silicon single crystal ingot is produced by the pulling method, the silica crucible to be used is also required to have a larger diameter.

In order to produce the silicon single crystal ingot by the pulling method, it is usually required to use a silica crucible having a diameter corresponding to about three times the diameter of the ingot.

When the silica crucible is produced by the above-mentioned rotating mold method, a portion having a small outer diameter and a thin thickness (hereinafter referred to as a small-diameter thinned portion) occurs in an upper part of the silica crucible, and hence it is required to remove the small-diameter thinned portion by cutting.

When the silica crucible is heated to a high temperature in a step for filling and melting Si in the silica crucible to pull a Si single crystal, the viscosity of silica is reduced as the temperature rises and hence the silica crucible is easily deformed. Especially when the upper part of the silica crucible is the small-diameter thinned portion, it is apt to be fallen down inward and easily deformed.

A cause of forming such a small-diameter thinned portion is that heat easily escapes at the opening portion of the mold and the silica or quartz powder is not completely melted by arc heating, and hence the outer diameter at the upper part of the silica crucible becomes small and the thickness thereof becomes thin. The formation of such a small-diameter thinned portion is unavoidable in the production process.

As a technique for preventing the small-diameter thinned portion of the crucible from falling down inward, JP-A-2006-96616 proposes a silica glass crucible in which a ring-shaped member preferably made of carbon is embedded in the upper portion of the crucible. The development of such a silica glass crucible can reduce the falling of small-diameter thinned portion of the crucible inward. However, the formation of the small-diameter thinned portion cannot be completely prevented. Therefore, it is still difficult to produce a good silicon single crystal ingot by the pulling method even when such a silica glass crucible is used.

Therefore, when the silica crucible is produced by the rotating mold method, by anticipating the formation of the small-diameter thinned portion is produced a silica crucible having a crucible height higher by the small-diameter thinned portion than a height of a product specification and then the small-diameter thinned portion is removed by cutting to obtain a product. Also, silica crucibles having different heights may be produced in the same mold. Although there is no problem in the production of a silica crucible having a higher height, a portion to be removed by cutting becomes large in the production of a silica crucible having a low height. In order to solve the problem, a mold for exclusive use for a product having a low height may be provided, but when the number of silica crucibles produced is small or the like, there is a disadvantage that the production cost of a new mold and related costs become significant.

As described above, when the silica crucible is produced by the rotating mold method, the formation of the small-diameter thinned portion is unavoidable, so that a silica crucible having a crucible height higher by the small-diameter thinned portion than a height of a product specification is produced and then the small-diameter thinned portion is removed by cutting to obtain a product (silica crucible) through usual steps.

However, the silica crucible is recently required to have a large diameter with the increase of the diameter of the silicon single crystal ingot as described above. When the diameter of the crucible is made larger, a portion obliged to be removed by cutting is also increased due to the small-diameter thinning, which causes a serious problem in terms of the material cost, and hence the production cost.

For example, if it is intended to produce a crucible having an outer diameter of about 457 mm (18 inches) and a thickness of 8 mm, about 0.3 kg of silica or quartz powder as an absolute amount is used extra per cutting-removing height of 10 mm.

On the other hand, if it is intended to produce a large-size silica crucible having an outer diameter of about 813 mm (32 inches), the thickness increases to approximately 15 mm, and hence about 1.0 kg of silica or quartz powder as an absolute amount is used extra per cutting-removing height of 10 mm.

In the production of a large-size silica crucible, therefore, the wasted amount of silica or quartz powder used per cutting-removing height in the production of one crucible increases to three to four times that of producing a small-size silica crucible.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The invention is developed in the light of the above situation and is to provide a mold for producing a silica crucible capable of reducing a portion obliged to be removed by cutting due to the small-diameter thinning in the upper part of the silica crucible to effectively reduce the material cost.

That is, the summary and construction of the invention are as follows:

1. A mold for use in the production of a silica crucible comprising: a step portion on an inner side of an upper opening portion of the mold; and a ring-shaped heat insulating barrier member having an inner diameter smaller than that of the mold is disposed on the step portion through a hollow disk-shaped support member having an inner diameter equal to or larger than that of the heat insulating barrier member.

2. A mold for use in the production of a silica crucible according to item 1, wherein the barrier member is made of silica.

3. A mold for use in the production of a silica crucible according to item 1, wherein the support member is made of carbon or composite of carbon and ceramics.

4. A mold for use in the production of a silica crucible according to item 1, wherein a protruding thickness $t_1$ of an inner surface of the ring-shaped barrier member from an inner peripheral wall of the mold, which is defined by $t_1$=(inner diameter of mold−inner diameter of barrier member)/2, is 20 to 80% of an attached thickness $t_2$ of silica or quartz powder.

5. A mold for use in the production of a silica crucible according to item 1, wherein an inner surface of the barrier member has a surface roughness of 6.3 to 25 μm as an arithmetic mean roughness Ra.

6. A mold for use in the production of a silica crucible according to item 1, wherein the support member is of one-piece-type or split-type.

7. A mold for use in the production of a silica crucible according to item 1, wherein the step portion of the mold is at a location corresponding to an upper part of the silica crucible.

8. A mold for use in the production of a silica crucible according to item 1, wherein the mold is used in a rotating mold method.

According to the invention, it is possible to reduce a portion to be removed by cutting due to the small-diameter thinning as compared with the conventional technique, and as a result, the material cost as well as the production cost can be reduced.

Furthermore, according to the invention, the barrier member can be put on the support member in use even when the outer diameter of the barrier member is smaller than the inner diameter of the mold, so that a thick barrier member is not necessarily prepared. Thus, barrier members having various inner diameters can be used, and hence the degree of freedom in the inner diameter of the barrier member is high.

Moreover, it is advantageous that the barrier member and the support member can be easily separated from the mold, which facilitates the removal of a silica crucible from the mold. In addition, the support member can be simply taken out by using a split-type support member.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

The invention will be described concretely with reference to the accompanying drawings, wherein.

DESCRIPTION OF THE PREFERRED EMBODIMENTS

Figure 1:
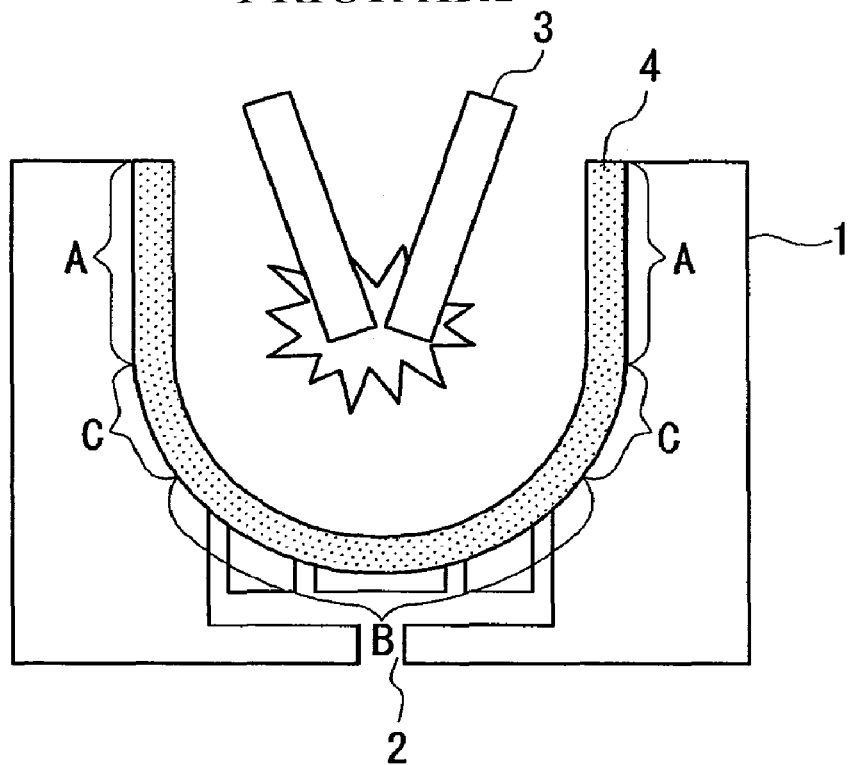
FIG. 1 is a cross-sectional view illustrating a production manner of a silica crucible by a rotating mold method.

In FIG. 1 is schematically shown a typical production manner of a silica crucible by a rotating mold method. In FIG. 1, numeral 1 is a mold, numeral 2 a vent line, numeral 3 an arc electrode, and numeral 4 silica or quartz powder attached onto an inner wall of the mold 1. Moreover, the mold 1 comprises a cylindrical straight body A, a cone-shaped bottom portion B and a corner portion C connecting them as shown in FIG. 1.

In the rotating mold method, the silica or quartz powder 4 attached onto the inner wall of the rotating mold 1 can be vitrified by heat-fusing through arc heating and shaped into a crucible form.

Figure 2:
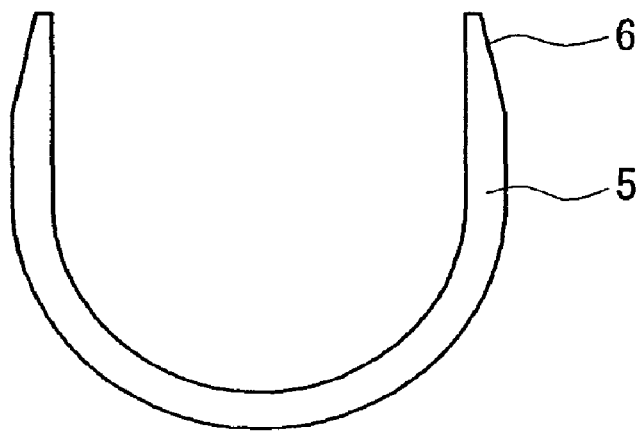
FIG. 2 is a cross-sectional view of a silica crucible produced using a general mold as is known in the art.

In FIG. 2 is shown a cross-sectional shape of a vitreous silica crucible 5 produced by using a conventional general mold as is known in the art.

As shown in FIG. 2, the upper portion of the vitreous silica crucible 5 becomes smaller in the outer diameter and thinner in the thickness to generate a small diameter thinned portion 6.

Figure 3:
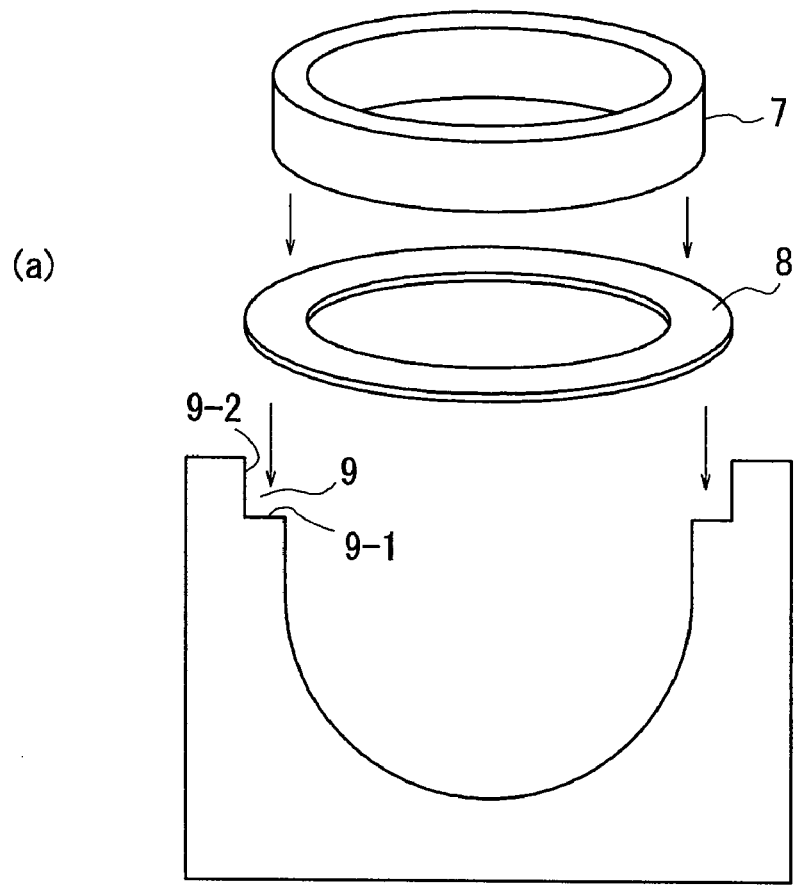
FIG. 3 is a schematic view of a mold according to the invention, wherein (a) is an exploded view of the mold and (b) is a diagram showing a state of disposing a barrier member and a support member.
Figure 3:
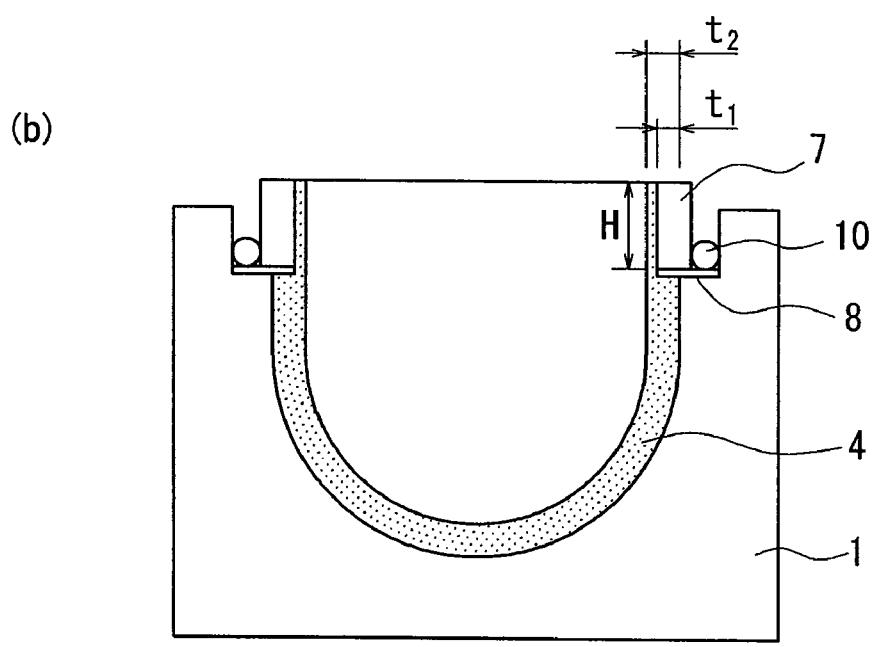

The invention solves the problem by using a mold having a structure as shown in FIG. 3.

The invention is based on a technological idea that if an upper portion of a silica crucible becomes unavoidably smaller in the outer diameter and thinner in the thickness in the production of the crucible, a barrier member is used in such a portion to preliminarily render the mold shape into a shape corresponding to the shape of the upper portion of the crucible, whereby the amount of silica or quartz powder wastefully used can be reduced, and a barrier member having an outer diameter smaller than the inner diameter of a mold can be used by inserting a support member therebetween, so that a thick barrier member is not required.

Also, the invention is based on a technological idea that if a barrier member is of a replaceable structure, the degree of freedom in the inner diameter of the barrier member increases but also the silica crucible is taken out easily from the mold, and it is particularly easier to take out the silica crucible by using a split-type support member.

In FIG. 3, the main structural parts are the same as in the conventional mold shown in FIG. 1 and are represented by the same numerals. Numeral 7 is a barrier member and numeral 8 is a support member therefor.

In the invention, as shown in FIG. 3(a), the inner side of the upper opening portion of the mold 1 is ground to obtain a step portion. Then, on a bottom face 9-1 of the step portion 9 is disposed a hollow disk-shaped support member 8 having an inner diameter equal to or somewhat larger than the diameter of the barrier member 7. The support member 8 may be either of onepiece-type or split-type. When the support member is of split-type, it is preferable to be divided into two or three.

Then, the ring-shaped barrier member 7 having an inner diameter smaller than that of the mold 1 is disposed on the support member 8.

The support member 8 is preferable to be disposed closely on the step portion 9. On the other hand, it is preferable that the detaching of the barrier member 7 is facilitated by making an outer diameter somewhat smaller than an inner diameter of a side face 9-2 of the step portion 9. In the disposition of the barrier member 7 as mentioned above, a gap is caused between the outer circumference of the barrier member 7 and the side face 9-2 of the step portion 9, so that it is preferable to insert a restriction member 10 into such a gap for preventing change of position in the barrier member 7.

Although the shape and size of the restriction member 10 are not particularly limited, it is desirable that the restriction member can surely prevent the change of position in the barrier member 7 and facilitate the detaching thereof. FIG. 3(b) shows a case wherein four spherical members each fitting in the gap are disposed between the outer circumference of the barrier member 7 and the side face 9-2 of the step portion 9 as the restriction member 10. As the restriction member 10 is advantageously adapted an oval or cylindrical member.

In the invention, the barrier member has a ring shape having an inner diameter smaller than that of the mold.

A protruding thickness $t_1$ of an inner surface of the barrier member 7 from an inner peripheral wall of an opening portion of the mold is preferable to be 20 to 80% of an attached thickness $t_2$ of silica or quartz powder.

When the ratio of the protruding thickness $t_1$ to the attached thickness $t_2$ is less than 20%, the effect of reducing the silica or quartz powder used, and hence the cost-saving effect is small, while when it exceeds 80%, there is a risk that the barrier member will be deformed by heat.

Moreover, the height H of the barrier member 7 may be equal to the height of the small-diameter thinned portion. For example, when a crucible having an outer diameter of about 813 mm (32 inches) and a thickness of 15 mm is produced, the height of the small-diameter thinned portion is about 30 to 100 mm.

On the other hand, the thickness of the barrier member 7 may be about 7 to 15 mm.

In the invention, the inner surface of the barrier member is preferable to have a surface roughness of 6.3 to 25 μm as an arithmetic mean roughness Ra.

When the roughness of the inner surface in the barrier member is less than 6.3 μm as Ra, silica or quartz powder easily moves at the time of attachment or heat-fusion of the silica or quartz powder and hence the deterioration of the crucible accuracy is caused, while when it exceeds 25 μm, grains fall off from the surface of the barrier member and become impurities of the silica crucible.

On the other hand, the inner diameter of the support member is set to be equal to or somewhat larger than the barrier member. The difference of inner diameter between both is preferable to be not more than 2 mm. When the inner diameter of the support member is too small, the barrier member can be easily separated from the silica crucible when the silica crucible is taken out, but the deterioration and consumption of the support member due to arc heating become larger. On the other hand, when the inner diameter of the support member is too large, the deterioration and consumption of the support member due to arc heating do not occur, but it becomes difficult to separate the barrier member from the silica crucible.

Furthermore, the thickness of the support member is preferably about 2 to 10 mm, more preferably about 3 to 5 mm. When the thickness of the support member is too small, the barrier member cannot be supported sufficiently, while when the thickness of the support member is too large, its weight increases and it becomes more expensive.

In the invention, the barrier member is preferable to be excellent in the heat insulating properties and heat resistance and small in the thermal expansion and variation with time, which is exemplified as follows:

(1) quartz (thermal conductivity: 5 to 10 W/mK, coefficient of thermal expansion: about $5.6 \times 10^{-7}/°C.$);

(2) carbon (thermal conductivity: about 140 W/mK, coefficient of thermal expansion: about $5 \times 10^{-6}/°C.$).

In the invention, the support member is preferable to have a high melting point and be excellent in the heat resistance, which is exemplified as follows:

(1) carbon:

(2) composite of carbon and ceramics (silicon carbide or boron carbide);

(3) super-heat-resistant alloy (Fe-based alloy, Ni-based alloy, Co-based alloy and the like);

(4) high-melting point metal and its alloy (Cr, Nb, Mo, Ta, W, inconel and the like).

Example 1

When a silica crucible is produced with a mold having the conventional structure shown in FIG. 1, the weight of silica or quartz powder used in a cutting portion at the upper part of the crucible is represented by the following equation:

Weight of silica or quartz powder used={(inner radius of mold)$^2$−(inner radius of mold−attached thickness)$^2$}×3.14×cutting height×bulk specific gravity of silica or quartz powder (B value).

On the other hand, when a silica crucible is produced with a mold having a structure according to the invention shown in FIG. 3, the amount of silica or quartz powder used can be reduced by an amount represented by the following equation:

Amount of silica or quartz powder reduced={(inner radius of barrier member+protruding thickness)$^2$−(inner radius of barrier member)$^2$}×3.14×(height of barrier member+thickness of support member)×bulk specific gravity of silica or quartz powder (A value)

The inner diameter of the barrier member is approximate to the inner diameter of the support member.

Therefore, according to the invention, the amount of silica or quartz powder used can be reduced as compared with the conventional case by an amount shown by (A/B)×100(%)

When an 18 inch silica crucible having an outer diameter of 458 mm and a thickness of 8 mm is produced with the mold having a structure according to the invention as shown in FIG. 3, B value=1.9 kg and A value=0.8 kg are obtained, and hence the amount of silica or quartz powder used can be reduced by about 42% as compared with the conventional case and by an absolute amount of about 0.13 kg per cutting-removing height of 10 mm (provided that a cutting height of an upper part of a crucible is 60 mm; an inner diameter of a barrier member is 448 mm; a height H of a barrier member is 45 mm; a thickness of a support member is 5 mm; a protruding thickness $t_1$ of a barrier member is 9 mm; an attached thickness $t_2$ of silica or quartz powder is 18 mm; and a bulk specific gravity of silica or quartz powder is 1.23).

Example 2

When a 32 inch silica crucible having an outer diameter of 810 mm and a thickness of 15 mm is produced with the mold shown in FIG. 3 in the same manner as in Example 1, A-value=6.5 kg is obtained, and hence the amount of silica or quartz powder used can be reduced by about 45% as compared with the conventional case of B-value=14.5 kg, which corresponds to about 0.54 kg per cutting-removing height of 10 mm as an absolute amount (provided that a cutting height of an upper part of a crucible is 120 mm; an inner diameter of a barrier member is 780 mm; a height H of a barrier member is 100 mm; a thickness of a support member is 5 mm; a protruding thickness $t_1$ of a barrier member is 20 mm; an attached thickness $t_2$ of silica or quartz powder is 40 mm; and a bulk specific gravity of silica or quartz powder is 1.23).

Thus, when the invention is applied to the production of large-size silica crucibles, the greater effect of reducing the amount of silica or quartz powder used can be obtained.

While illustrative embodiments have been illustrated and described, it will be appreciated that various changes can be made therein without departing from the spirit and scope of the invention.

What is claimed is:

1. A mold for use in the production of a silica crucible, comprising:
   a step portion on an inner side of an upper opening portion of the mold; and
   a ring-shaped heat insulating barrier member having an inner diameter smaller than that of the mold is disposed on the step portion through a hollow disk-shaped support member having an inner diameter equal to or larger than that of the heat insulating barrier member.

2. A mold for use in the production of a silica crucible according to claim 1, wherein the barrier member is made of silica.

3. A mold for use in the production of a silica crucible according to claim 1, wherein the support member is made of carbon or composite of carbon and ceramics.

4. A mold for use in the production of a silica crucible according to claim 1, wherein a protruding thickness $t_1$ of an inner surface of the ring-shaped barrier member from an inner peripheral wall of the mold, which is defined by $t_1$=(inner diameter of mold−inner diameter of barrier member)/2, is 20 to 80% of an attached thickness $t_2$ of silica or quartz powder.

5. A mold for use in the production of a silica crucible according to claim 1, wherein an inner surface of the barrier member has a surface roughness of 6.3 to 25 μm as an arithmetic mean roughness Ra.

6. A mold for use in the production of a silica crucible according to claim 1, wherein the support member is of one-piece-type or split-type.

7. A mold for use in the production of a silica crucible according to claim 1, wherein the step portion of the mold is at a location corresponding to an upper part of the silica crucible.

8. A mold for use in the production of a silica crucible according to claim 1, wherein the mold is used in a rotating mold method.

* * * * *